United States Patent
Baschirotto et al.

[11] Patent Number: 6,031,416
[45] Date of Patent: Feb. 29, 2000

[54] FIRST AND SECOND ORDER CMOS ELEMENTARY CELLS FOR TIME-CONTINUOUS ANALOG FILTERS

[75] Inventors: Andrea Baschirotto, Tortona; Ugo Baschirotto, Iseo; Guido Brasca, Varese; Rinaldo Castello, Arcore, all of Italy

[73] Assignee: STMicroeletronics S.r.l., Agrate Brianza, Italy

[21] Appl. No.: 09/067,127

[22] Filed: Apr. 27, 1998

[51] Int. Cl.[7] .................................................. H03K 5/00
[52] U.S. Cl. ...................... 327/552; 327/344; 327/362; 327/437; 327/427; 327/311; 333/172
[58] Field of Search ................................ 327/552, 558, 327/336, 344, 437, 311, 362, 103, 427; 333/172

[56] References Cited

U.S. PATENT DOCUMENTS 5,883,545  3/1999  Boyd ........................................ 327/552

*Primary Examiner*—Dinh Le
*Attorney, Agent, or Firm*—Theodore E. Galanthay; Allen, Dyer, Doppelt, Milbrath & Gilchrist, P.A.

[57] ABSTRACT

A CMOS elementary cell of the first order for time-continuous analog filters with non-linearity compensation, is connected between a first supply voltage reference and a second voltage reference. The cell is of a type which comprises at least a first MOS transistor having its conduction terminals connected to the first supply voltage reference and to an output terminal, and having a control terminal connected to an input terminal of the first order CMOS elementary cell. The cell further comprises a second MOS transistor in diode configuration, and an equivalent capacitor, both connected to the output terminal of the first order CMOS elementary cell. The second, diode-connected MOS transistor and the equivalent capacitor act as a load for the first MOS transistor. The first MOS transistor operates as a drive transistor operatively tied to an input voltage signal being supplied to the input terminal of the first order CMOS elementary cell. A second order filter CMOS elementary cell is similarly connected.

35 Claims, 4 Drawing Sheets

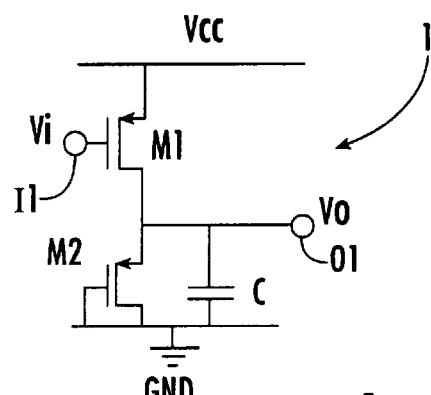
*FIG. 1.*
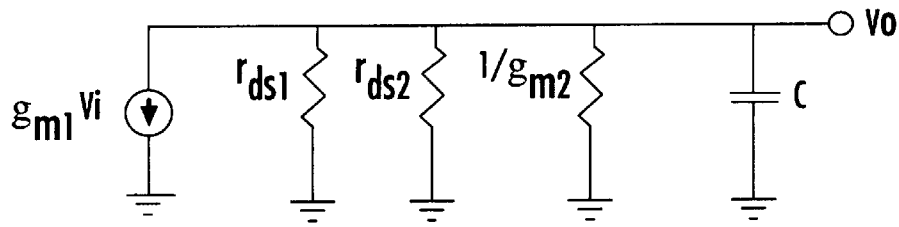
*FIG. 2.*
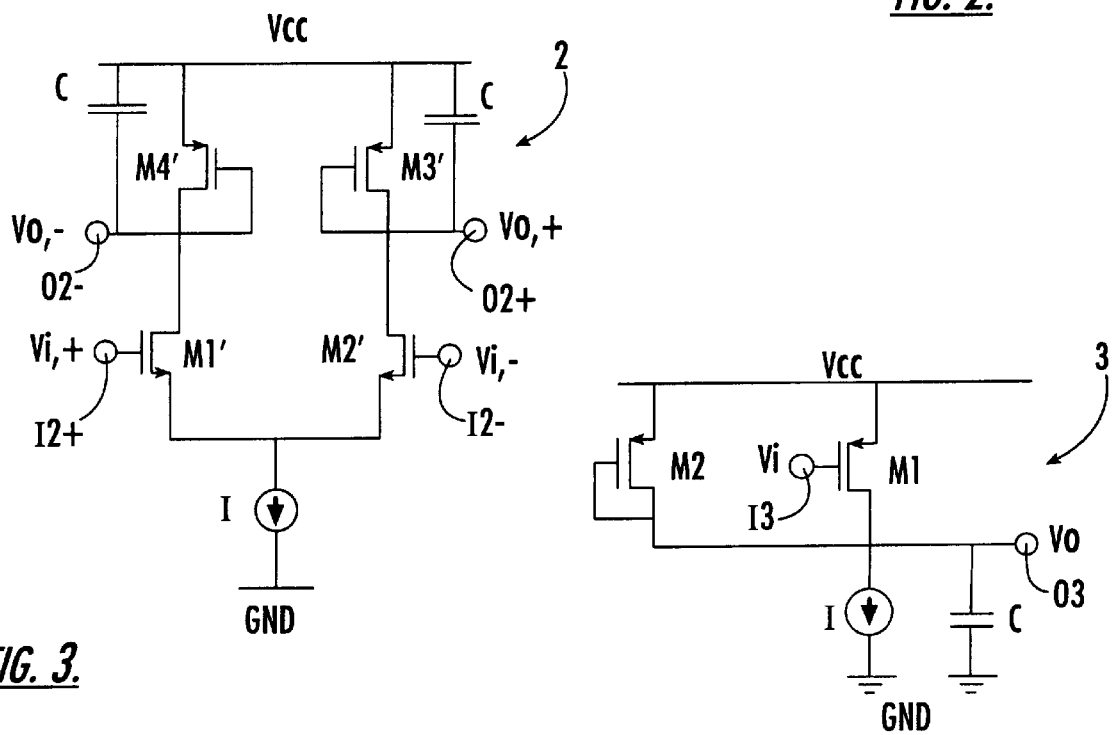
*FIG. 3.*
*FIG. 4.*

FIRST AND SECOND ORDER CMOS ELEMENTARY CELLS FOR TIME-CONTINUOUS ANALOG FILTERS

FIELD OF THE INVENTION

This invention relates to first and second order CMOS elementary cells for time-continuous analog filters with non-linearity compensation.

BACKGROUND OF THE INVENTION

Time-continuous analog filters are extensively employed in systems for analog processing of high-frequency signals. A typical application is data reading from bulk memories (known in the pertinent literature as "disk-drive applications"). In this application, the cutoff frequencies of the filters currently lie in the 50 to 100 MHZ range.

As is well known, integrated electronic filters for high-frequency applications are currently manufactured using mixed bipolar-complementary MOS (BiCMOS) technologies Manufacturing with BiCMOS technology has certain drawbacks which have led the market to favor approaches based on purely CMOS technology. In this case, the MOS transistors can be operated within their linear or saturation range. An optimum solution would be operation in the linear range, where the transconductance of the transistors would also be linear and for a wider range of signals. Unfortunately, tranconductance in the linear range is lower in value than in the saturation range, and the resulting device has, therefore, a higher power consumption.

There are also several known alternative approaches for making time-continuous filters with high linearity. However, all these approaches have a drawback in that they exhibit non-linear transconductance when the MOS transistors are operated in the saturation range.

SUMMARY OF THE INVENTION

In view of the foregoing background, it is therefore an object of the present invention to provide a first and second order CMOS elementary cell structure for making time-continuous filters with constructional and functional features allowing the non-linearities of the resulting filter to be compensated, and while retaining a sufficiently high level of performance in terms of dynamic range speed of the processed signal and total harmonic distortion (THD).

The principle of this invention is to provide first and second order CMOS elementary cells which include a load structure adapted to tie the operation of a transistor in the cell to an input voltage signal supplied to the cell input terminal. A first order or second order CMOS elementary cell is connected between a first supply voltage reference and a second voltage reference. The cell is of a type which comprises at least a first MOS transistor having its conduction terminals connected to the first supply voltage reference and to an output terminal, and having a control terminal connected to an input terminal of the first order CMOS elementary cell. A second MOS transistor is connected in a diode configuration. The second MOS transistor and an equivalent capacitor are connected to the output terminal and act as a load for the first transistor.

BRIEF DESCRIPTION OF THE DRAWINGS

The features and advantages of the invention will be apparent from the following description of embodiments thereof, given by way of example and not of limitation with reference to the accompanying drawings in which:

FIG. 1 shows schematically a first order CMOS elementary cell embodying this invention;

FIG. 2 shows schematically an equivalent model of the first order CMOS elementary cell in FIG. 1;

FIG. 3 shows schematically a differential configuration for the first order CMOS elementary cell in FIG. 1;

FIG. 4 shows a modified embodiment of the first order CMOS elementary cell in FIG. 1;

DETAILED DESCRIPTION OF THE PREFERRED EMBODIMENTS

Figure 5:
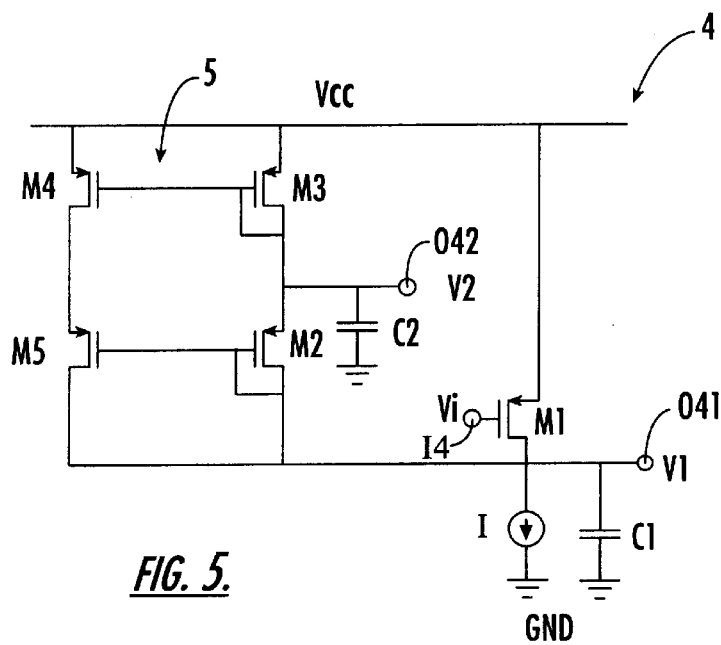
FIG. 5 shows schematically a second order CMOS elementary cell embodying this invention.

Most analog filters can be formed from elementary cells of the low-pass filter type. These cells may be of the first or the second order, and alternatives will be described hereinafter covering either case. Referring in particular to FIG. 1, generally and schematically shown at 1 is a CMOS elementary cell of the first order according to this invention. This cell is particularly, but not exclusively, intended for making programmable time-continuous analog filters.

The CMOS elementary cell 1 of the first order is connected between a first supply voltage reference Vcc and a second voltage reference, specifically a signal ground GND. The cell 1 comprises a series of first M1 and second M2 MOS transistors. In particular, the first MOS transistor M1 has a control terminal connected to an input terminal I1, and a conduction terminal connected to an output terminal O1 of the first order CMOS elementary cell 1. These input and output terminals, I1 and O1, receive an input voltage Vi and generate an output voltage Vo, respectively. The second MOS transistor M2 is diode-configured and connected between the output terminal O1 of the first order CMOS elementary cell 1 and the ground GND.

Advantageously in this invention, the first order CMOS elementary cell 1 further comprises an equivalent capacitor C connected between the output terminal O1 of the first order CMOS elementary cell 1 and the ground GND. This equivalent capacitor C represents all the parasitic capacitances associated with the node O1. The second, diode-connected MOS transistor M2 and the equivalent capacitor C act as a load for the first MOS transistor M1, operating as a drive transistor tied operatively to the input voltage signal Vi.

It should be noted that the first order CMOS elementary cell structure shown in FIG. 1 serves a transfer function of the first order, to be obtained from the equivalent model for small signals shown in FIG. 2 and where:

| | |
|---|---|
| gm1 and gm2 | are the transconductances of MOS transistors M1 and M2; |
| rds1 and rds2 | are the resistances across the drain and source terminals of MOS transistors M1 and M2. |

In a first order analysis, the resistances rds1 and rds2, i.e. the output resistances of the equivalent model in FIG. 2, can be neglected because they are far above the reciprocals of the transconductances (rds1>>1/gm1 and rds2>>1/gm2). Thus, the following expression for the transfer function is arrived at:

$$\frac{Vo}{Vi} = -\frac{gm2}{1 + s\frac{C}{gm2}} \quad (1)$$

Expression (1) highlights out that the behavior of the first order CMOS elementary cell 1 based upon frequency is characterized by a single pole at excitation:

$$Sp = gm2/C \quad (1a)$$

Thus, the first order CMOS elementary cell 1 affords advantages as specified below.

1. The response of the first order CMOS elementary cell 1 to wide signals is markedly linear, even if the MOS transistors M1 and M2 are operated in their saturation range (and therefore, their transconductances are no longer linear), since the non-linearities of the input transconductances are compensated by the non-linearities of the load impedance.

All this is true also for the differential configuration 2 for the first order CMOS elementary cell 1 shown in FIG. 3. In particular, the differential configuration 2 has first I2+ and second I2− differential input terminals connected to the control terminals of the first M1' and second M2' MOS transistors, suitably of the NMOS type. Also, the transistors M1' and M2' have their source terminals connected in common, and connected to the ground GND via a current generator I. Capacitors C are also connected in the circuit as illustrated for this first order CMOS elementary cell as shown in FIG. 3.

The differential configuration 2 further comprises third M3' and fourth M4' MOS transistors which are connected to the supply voltage reference Vcc and the drain terminals of the transistors M2' and M1'. The third and fourth MOS transistors, M3' and M4', have their control terminals respectively connected to first O2+ and second O2− differential output terminals of the differential configuration 2.

The differential input terminals I2+ and I2− receive first Vi+ and second Vi− input differential voltages. The differential output terminals O2+ and O2− deliver first Vo+ and second Vo− differential output voltages.

A simulation was carried out using the following dimensions for the circuit of FIG. 3:

| | |
|---|---|
| W1 = W2 = 30 µm, | W3 = W4 = 100 µm; |
| Li = 2 µm | I' = 200 µA; |
| V1 = V2 = 500 µV | V3 = V4 = 300 µV | where,

W1, W2, W3 and W4 are the widths of transistors M1', M2', M3' and M4';

Li is the common length of transistors M1', M2', M3' and M4';

I' is the value of current through the generator I;

V1, V2, V3 and V4 are the voltages at the control terminals of transistors M1', M2', M3' and M4'. The simulation showed that the circuit of FIG. 3 produced, for an input value 800 mVpp (Vpp being volts peak-to-peak) and a value 5V of the supply voltage Vcc, a THD (Total Harmonic Distortion) of −50 dB at a frequency of 25 MHz.

In essence, the compensation for non-linearities of the transconductances of the input transistors, and for the load impedance, is maintained until the effect of the capacitor C (whose impedance is inherently linear) becomes trivial. This occurs at frequency values below the pole frequency of the first order CMOS elementary cell 1.

On the other hand, at frequencies above the pole frequency of the first order CMOS elementary cell 1, the frequency response of the configuration would tend to reduce the harmonics which lie outside the band, thereby maintaining good linearity for the response of the first order CMOS elementary cell 1.

2. The MOS transistors M1 and M2 of the first order CMOS elementary cell 1, i.e. the input and load transistors, respectively, are operating on a single current leg, which affords reduced power consumption for the cell as a whole.

With structures of a higher order, a series connection of several cells of this type can only result in even greater power savings of the resulting structure. However, such reduced power consumption is obtained at the expense of limiting the operability of the first order CMOS elementary cell 1 to supply voltage levels of no less than 5V. A reduction in this supply voltage, e.g. down to 3V, would indeed result in the linearity range of the cell being drastically restricted.

To obviate this problem, the modified embodiment shown generally at 3 in FIG. 4 can be used. The first M1 and second M2 MOS transistors therein are connected in parallel with each other between the supply voltage reference Vcc and the output terminal O3. The second MOS transistor M2 is in a diode configuration, while the first MOS transistor M1 has a control terminal connected to the input terminal I1 of modification 3 of the first order CMOS elementary cell, so as to receive an input voltage Vi. In addition, the modified first order CMOS elementary cell 3 includes the generator I and equivalent capacitor C connected in parallel with each other between the output terminal O3 and the ground GND.

The modified first order CMOS elementary cell 3, therefore, shows a fold back toward the supply voltage reference Vcc of the load transistor M2. This allows the available dynamic range of the signal to be increased. In other words, the usable value of supply voltage Vcc may be reduced, based upon the condition that the level of the current delivered is doubled.

3. It is noteworthy that the cells so far discussed use P-channel MOS (PMOS) transistors, so as to have the channel zone isolated and the source-bulk voltage VSB=0 maintained. In this way, any rise in the threshold voltage of the transistors due to body effect can be prevented.

Thus, the use of PMOS transistors ensures invariance of the transconductance and non-linearity values as the supply voltage Vcc varies.

4. Advantageously in this invention, the modified first order CMOS elementary cell 3 makes control of the DC output voltage unnecessary, this voltage being set by the voltage across the gate and source terminals of the second, diode-connected MOS transistor M2.

The last-mentioned advantage is to be appreciated most where structures of the fully differential type are used, since it allows the use of additional control circuits for the common output mode to be avoided. In fact, in high frequency applications, for example, it is important that the necessary band and gain values be ensured for the circuit to operate properly. The variations of the bias voltages on the output nodes are then dependent on the current tuning only.

5. By eliminating the need for control of the common mode signal, plural stages can be coupled together in a very simple manner, while the cell circuit, formed of a fully differential structure, and the filter can be made simpler.

More cells can be arranged in cascade without being obliged to control their respective bias voltages, which are instead controlled directly by the bias voltages of the first stage in the cascade.

6. Neither the first order CMOS elementary cell 1 nor its modification 3 have parasitic poles.

This allows good control to be maintained of the frequency response of the cell and the filter formed thereby.

A second order CMOS elementary cell can now be derived from the first order CMOS elementary cell 1, as shown in FIG. 5. The second order CMOS elementary cell, or biquadratic cell 4, is formed from the MOS configuration shown in FIG. 1 by adding a current mirror 5 which comprises first M3 and second M4 mirror transistors.

In particular, the biquadratic cell 4 comprises a first MOS transistor M1 connected between a supply voltage reference Vcc and a first output terminal O41 delivering a first output voltage V1. In addition, the first MOS transistor M1 has a control terminal, connected to an input terminal I4 of the biquadratic cell 4, which receives an input voltage Vi. The biquadratic cell 4 further comprises a second MOS transistor M2 which is in a diode configuration, connected between the first output terminal O41 and a second output terminal O42 delivering a second output voltage V2.

Advantageously in this invention, the first output terminal O41 is further connected to a ground potential reference GND through a parallel of a current generator I and a first equivalent capacitor C1. Also, the second output terminal O42 is connected to the ground GND through a second equivalent capacitor C2.

Lastly, the biquadratic cell 4 comprises a matching transistor M5 which is connected between the second mirror transistor M4 and the first output terminal O41 and has its control terminal connected to the control terminal of the second MOS transistor M2. Therefore, the matching transistor M5 also is diode connected.

The mirror transistors M3 and M4 are suitably sized to provide a transfer function of the biquadratic cell 4 of the second order with matched complex poles. By having the matching transistor M5 diode connected, the matching of the bias voltages of the mirror transistors M3 and M4 can be improved to provide a more accurate current mirror 5.

Figure 6:
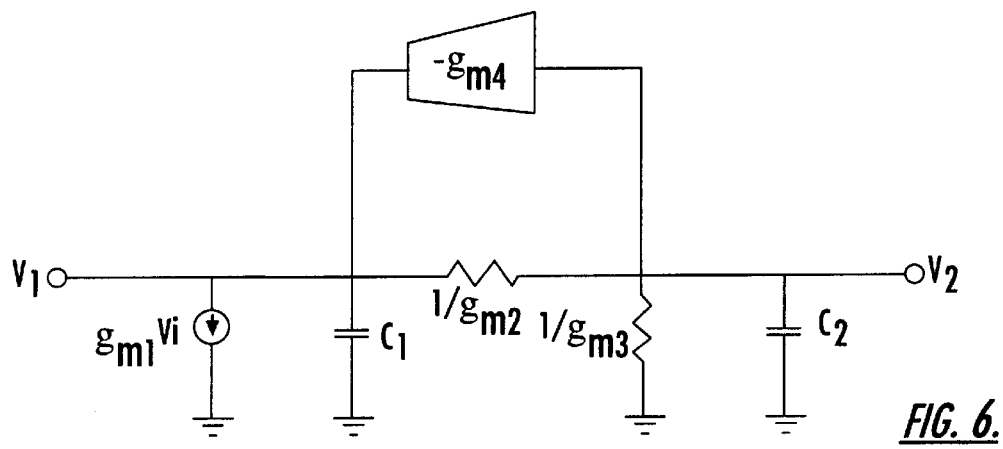
FIG. 6 shows schematically an equivalent model of the second order CMOS elementary cell in FIG. 5.

Neglecting the effect of the matching transistor M5, which acts as a current buffer, two transfer functions, T2=V2/Vi and T1=V1/Vi, can be obtained by means of the equivalent circuit for small signals shown in FIG. 6. In particular, it is:

gm1, gm2, gm3 and gm4 are the transcoductances of MOS transistors M1, M2, M3 and M4; and C1 and C2 are the equivalent capacitances C1, C2 associated with the output nodes.

It should be noted that Equations (2) and (3) above have been obtained by neglecting the output resistances of the MOS transistors, because they are placed in parallel with impedances of 1/gm.

Supposing that the transconductances of transistors M3 and M2 equal each other (gm3=gm2), i.e. that these transistors have the same design dimensions, and assuming a=gm4/gm3 and K=C2/C1, Equations (2) and (3) can be re-written as follows:

$$T1(s) = -\frac{KC1^2}{s^2 + \frac{\omega 0}{Q}s + \omega 0^2} \quad (4)$$

$$T2(s) = -\frac{KC1^2}{s^2 + \frac{\omega 0}{Q}s + \omega 0^2} \quad (5)$$

where:

$$\omega 0 = \frac{gm2}{C1}\sqrt{\frac{1+A}{K}} \quad (6)$$

$$Q = \sqrt{\frac{K(1+A)}{2+K}} \quad (7)$$

and, as is known, Ω0 is the characteristic excitation of the singularities, and Q is the Q-factor. Also, A is the transconductance ratio of mirror transistors M3, M4 and, as first approximation, remains constant as the bias current of these transistors varies.

It is readily seen from Expression (6) that the characteristic excitation Ω0 is dependent essentially on a single variable, namely the transconductance of the second MOS transistor M2. This dependence allows the pole frequencies of the transfer function involved to be varied, i.e. programmed, by just acting on the level of the bias current. This can be done without changing the value of the Q-factor and, hence, the form of the frequency response of the filter as a whole. The Q-factor is only tied to ratii between quantities which are unrelated to the current tuning.

Furthermore, the values of the characteristic pulsation Ω0 and the Q-factor are only dependent on parameters of P-channel devices for which the voltage VSB is zero. Thus, no rise in the threshold voltage of the MOS transistors is bound to occur due to body effect.

Let us see now how the current mirror 5 should be dimensioned to obtain a target value for the Q-factor. For positive values of the parameters C1 and C2, the Q-factor has, as K varies, a maximum at the value K=2, that is:

$$T2(s) = \frac{V2}{Vi}(s) = -\frac{gm1gm2}{s^2C1C2 + s(C1(gm3+gm2) + C2gm2) + gm2(gm3+gm4)} \quad (2)$$

$$T1(s) = \frac{V1}{Vi}(s) = -\frac{gm1(gm2+gm3+sC2)}{s^2C1C2 + s(C1(gm3+gm2) + C2gm2) + gm2(gm3+gm4)} \quad (3)$$

where, $$Q(K) = \sqrt{\frac{K(1+A)}{2+K}}, \text{ whence}$$

$$\frac{dQ}{dK} = \frac{\frac{(2+K)\sqrt{1+A}}{2\sqrt{K}} - \sqrt{(1+A)K}}{(2+K)^2} = 0$$

when K=2.
Therefore, for the Q-factor to attain a given value, the following condition must hold:

$$A > 8Q^2 - 1 \qquad (8)$$

and since A=gm4/gm3:

$$\frac{(W/L)_4}{(W/L)_3} > 8Q^2 - 1. \qquad (9)$$

From Expression (8), the corresponding minimum values of A can be obtained from certain significant values of the Q-factor, namely:

| | | | |
|---|---|---|---|
| Case a) | for | Q = 0.5 | A > 1 |
| Case b) | for | Q = 1/√2 | A > 3 |
| Case c) | for | Q = 1 | A > 7 |
| Case d) | for | Q = 2 | A > 31. |

In other words, to obtain matched complex poles (Case a)), a larger value of A then 1 should be used, while to provide overswings in the frequency response (Case b)), A should be larger than 3.

Figure 7:
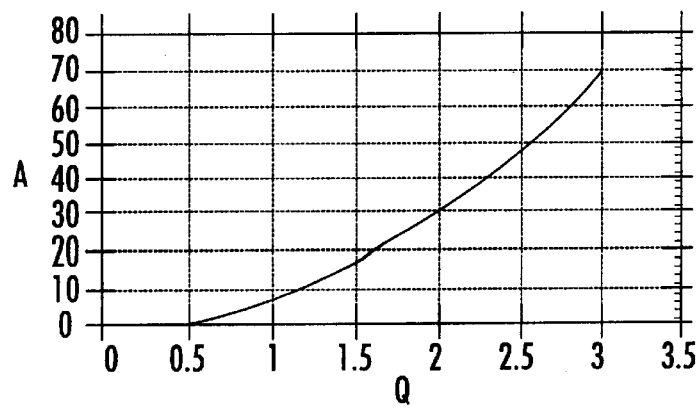
FIG. 7 is a schematic graph of a characteristic parameter of the equivalent model shown in FIG. 6.

More generally, the minimum value of A increases with the square of the Q-factor sought, as illustrated by FIG. 7. Thus, to obtain high values of the Q-factor, a current mirror 5 should be used which has a high ratio of the transistors M2 and M3 dimensions. However, with gm2=gm3, a reduction in the current flowing through the transistors M2 and M3 would lower the pole frequency.

Figure 8:
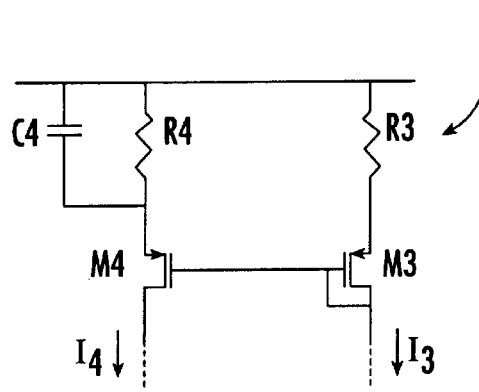
FIG. 8 shows schematically a modified embodiment of a detail of the second order CMOS elementary cell in FIG. 5.

Actually, since the Q-factor is determined by a transconductance ratio, i.e by small-signal parameters, high values can be implemented for the Q-factor without an excessively high ratio of the mirror transistors M3 and M4. This can be accomplished by means of a modified current mirror 6, shown schematically in FIG. 8.

In particular, the modified current mirror 6 comprises first R3 and second R4 mirror resistors connected between the supply voltage reference Vcc and, respectively, the first M3 and second M4 mirror transistors. The modified current mirror 6 further comprises a compensation capacitor C4 connected in parallel with the second mirror resistor R4, between the supply voltage reference Vcc and the second mirror transistor M4. The modified current mirror 6 permits a ratio of the currents I4 and I3 flowing through the mirror transistors M4 and M3, in DC current conditions, which is smaller than the ratio of the transconductances gm4 and gm3 at the frequencies normally used.

Figure 9:
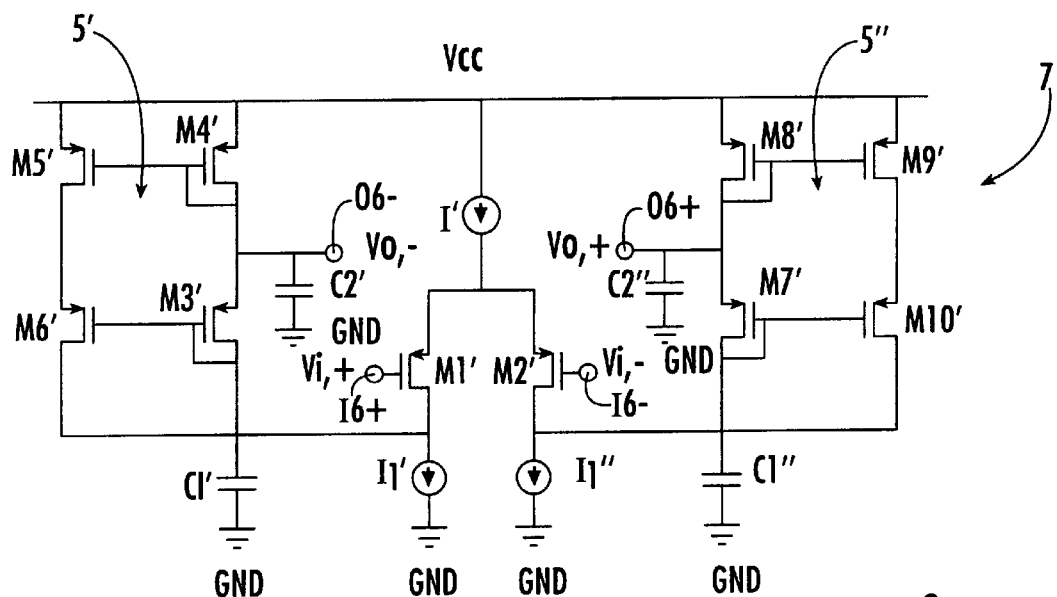
FIG. 9 shows schematically a differential configuration for the second order CMOS elementary cell in FIG. 5.

The biquadratic cell 4 has been described in relation to a single-ended type of structure, that is one having a single input signal and single output signal, both referenced to the ground GND. In order to expand the dynamic range of the output signal, however, fully differential schemes can be used such as that shown in FIG. 9.

In particular, the differential configuration 7 for the biquadratic cell 4 comprises first M1' and second M2' MOS transistors connected to the supply voltage reference Vcc via a first current generator I' and to the ground GND via first I1' and second I1" current generators. The transistors M1' and M2' have their control terminals respectively connected to first I6+ and second I6− differential input terminals. The differential configuration 7 further comprises first 5' and second 5" current mirrors which are connected directly to the supply voltage reference Vcc, and to the ground GND through first C1' and second C1" differential compensation capacitors. The current mirrors 5' and 5" are also connected to first O6− and second O6+ differential output terminals, themselves connected to ground through third C2' and fourth C2" differential compensation capacitors. In the embodiment shown in FIG. 7, the first current mirror 5' comprises MOS transistors M3', M4', M5' and M6', while the second current mirror 5" comprises transistors M7', M8', M9' and M10' which are configured the same as the current mirror 5 of the biquadratic cell 4 shown diagramatically in FIG. 5.

The differential configuration 7 allows the output swing to be increased twofold, and accordingly, the dynamic range of the whole structure to be increased by 3 dB. In addition, by adopting fully differential structures, harmonic distortion can be attenuated and the PSRR (Power Supply Rejection Ratio) increased.

Theoretically, the differential configuration 7 would only process signals of the differential type, specifically an input voltage Vi and output voltage Vo, respectively given as:

Vi=Vi+ −Vi− and Vo=Vo+ −Vo− whereas the common mode input signals would not, at least in theory, be output. This means that the differential configuration 7 has a high rejection to common mode input signals.

In particular, noise on the supply lines, seen as a common mode signal from the input, would be greatly attenuated. Also, the current generators I', I1' and I1" provided allow the circuit to be biased by adjusting the level of the current being delivered. In other words, with the differential configuration 7, the pole frequency can be varied, and with it, the characteristic pulsation Ω0 of a filter formed from a biquadratic cell thus obtained, by wise adjustment of currents.

It should be noted that the differential configuration 7 for the biquadratic cell 4 offers, in fact, all of the advantages discussed in connection with the differential configuration 2 for the first order CMOS elementary cell 1. In particular, as said before in relation to the differential configuration 2 for the first order CMOS elementary cell 1, the differential configuration 7 requires no common mode control circuits, because the voltages on the output nodes are set by the diode-connected MOS transistors M3', M4', M7' e M8, and the variations of such voltages are determined solely by the bias current tuning.

Figure 10:
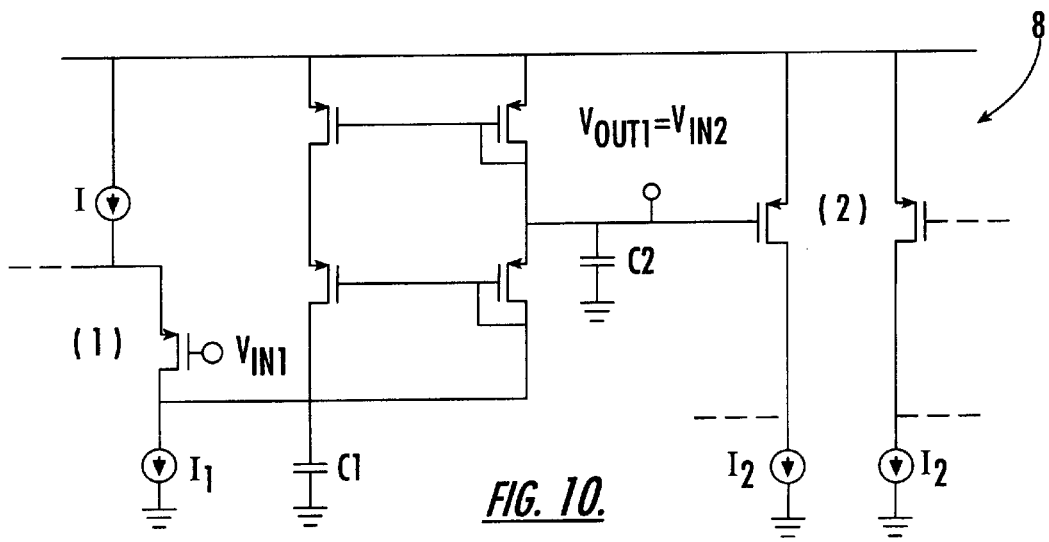
FIG. 10 shows one possible cascade structure of a plurality of second order CMOS elementary cells as in FIG. 5.

Thus, several biquadratic cells can be connected into a cascade structure 8 as shown schematically in FIG. 10, without their respective bias currents having to be controlled, as set directly by the bias voltages of the first stage. In particular, in the cascade structure 8, the output terminals of a first stage (1) have been connected to the input terminals of a second stage (2), and so on through the following stages, with the stages comprising biquadratic cells implemented in the differential configuration.

It should be noted here that the stages after the first (1) are pseudo-differential stages, requiring no current generator I' connected to the supply voltage reference Vcc. Simulations carried out for the biquadratic cell 4 of FIG. 5 have brought out deep variations of the Q-factor with the bias current tuning which may amount to 4–5% of the nominal value of the Q-factor within each tuning interval and to 8% over the entire frequency range of a filter formed of biquadratic cells of this type.

Such variations are easily explained by an analysis of the schematically equivalent circuit of the biquadratic cell 4 shown in FIG. 6. In particular, it has been already shown that the value of the Q-factor depends on a transconductance ratio of MOS transistors, which ratio remains constant as the bias current of the transistors varies. It was therefore inferred, as first approximation, that the Q-factor also was unrelated to the tuning of the current involved.

Actually, the output impedances of the MOS transistors have been left out in the equivalent circuit of FIG. 6. By now inserting the conductance between the drain and source terminals of the MOS transistors, the following relation can be obtained from the equivalent circuit of FIG. 6:

$$\frac{V2}{Vin} = -\frac{gm1\,R3r4}{s^2 R2R3R4C1V1 + s(R3R4C2 + R2R3C2 + R3R4C1 + R2R4C1) + R2 + R3 + R4 + gm4R3R4} \quad (10)$$

it being that:

$$R2 = \frac{1}{gm2 + gds2}; \quad (11)$$
$$R3 = \frac{1}{gm3 + gds3};$$
$$R4 = \frac{1}{gds4}$$

where, gm2, gm3 and gm4 are the transconductances, and gds2, gds3 and gds4 are the drain-source conductances of MOS transistors M2, M3 and M4, respectively.

A few algebraic calculations provide the following expression for the Q-factor:

$$Q = \frac{\sqrt{R2 + R3 + R4 + gm4R3R4)(R2R3R4C1C2)}}{R3R4C2 + R2R3C2 + R3R4C1 + R2R4C1} \quad (12)$$

It should be recalled that, for a MOS transistor in the saturated condition, the transconductance gm and drain-source conductance are respectively given by:

$$gm = \frac{2ID}{VGS - Vth}; \; gds = \lambda ID \quad (13)$$

where,

λ is the modulation parameter of the MOS transistor channel;

ID is the tuning current of the MOS transistor;

VGS is the voltage across the gate terminal and source terminal of the MOS transistor; and Vth is the threshold voltage of the MOS transistor.

It is seen, from Expression (11), that the resistance of R4 varies in a proportionately different manner from the resistances of R2 and R3. This is due to the MOS transistor M4 not being diode connected, whereas the transistors M2 and M3 of the biquadratic cell 4, shown in FIG. 5, are so connected.

Figure 11:
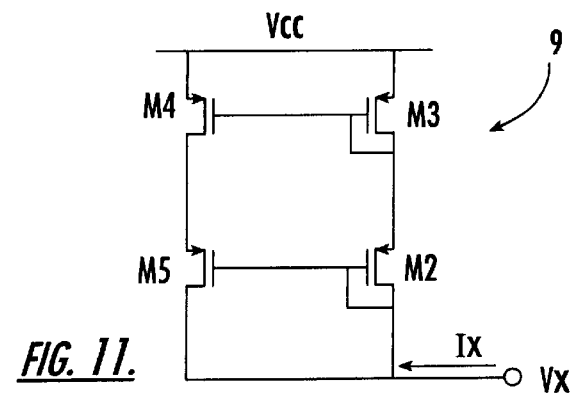
FIG. 11 shows schematically an equivalent model for computing the input resistance to a second order CMOS elementary cell as in FIG. 5.

The current mirror 5, comprising the MOS transistors M2, M3, M4 and M5, will therefore present an impedance to the input transconductor which varies with the bias current. The resistance of the input resistor Rin of the current mirror 5 can, in fact, be found from the schematics 9 in FIG. 11 to be:

$$Rin = \frac{Vx}{Ix} = \frac{R2 + R3}{1 + gm4R3 + gds4(R2 + R3)} \quad (14)$$

Simulations showed that the resistance of the resistor Rin increases by about 75% in going from the maximum level (tuning+) to the minimum level (tuning−) of the bias current.

Figure 12:
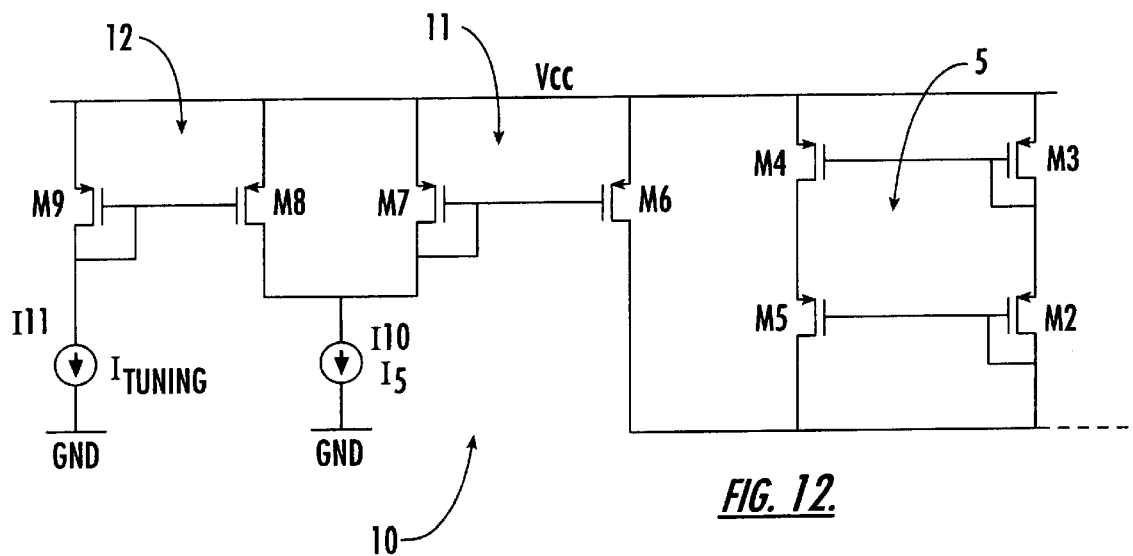
FIG. 12 shows a compensation circuit according to the invention.

To cancel the effect of this varying mirror resistance, a compensation circuit 10 can be used, as schematically shown connected to the current mirror 5 in FIG. 12. The compensation circuit 10 comprises first 11 and second 12 compensation mirrors which are connected, in parallel with each other, between the supply voltage reference Vcc and the ground GND.

In particular, the first compensation mirror 11 comprises a first compensation MOS transistor M6, having its conduction terminals connected to the supply voltage reference Vcc and the current mirror 5. The first compensation transistor M6 also has its control terminal connected to the control terminal of a second compensation MOS transistor M7 in a diode configuration. The second compensation MOS transistor M7 has its conduction terminals connected to the supply voltage reference Vcc, and to the ground GND through a first current generator I10. The second compensation mirror 12 comprises a third compensation MOS transistor M8 having its conduction terminals respectively connected to the supply voltage reference Vcc and to the ground GND through the first generator I10, having a control terminal connected to the control terminal of a fourth compensation MOS transistor M9 in diode configuration, and having its conduction terminals connected to the supply voltage reference Vcc and to the ground GND through a second current generator I11. In particular, the second current generator I11 delivers a current which is same as the tuning current, i.e. the current I' shown in FIG. 9. The compensation circuit 10 has no effect when the bias current is at its maximum level (tuning+), but allows the drain-source conductance value gds4 of the MOS transistor M4 to be increased in proportion to the decrease of the tuning current, designated Ituning in FIG. 12.

In addition, the level of the current of the first current generator I10 equals the maximum level of the current from the second compensation mirror 12 comprising the MOS transistors M8 and M9. In this situation, the MOS transistors M6 and M7 are 'off'; in particular, the transistor M6 has zero drain-source conductance. To evaluate the input resistance to the biquadratic cell 4 connected in a circuit scheme like that shown in FIG. 12, reference can be had to the schematics 9 of FIG. 11 and to Expression (14) obtained therefrom. The compensation circuit 10 leaves that input resistance unaffected.

The operation of the compensation circuit 10 of this invention is now further explained. As the tuning current decreases, the difference between the current Is being delivered from the first current generator I10 and the tuning current Ituning from the second current generator I11 is mirrored by the MOS transistor M7, thereby causing the MOS transistor M6 to conduct. This MOS transistor M6 will then present a drain-source conductance given by:

$$gds6=\lambda(Is-Ituning) \quad (15)$$

Being connected in parallel with the second mirror transistor M4 of the current mirror 5, the MOS transistor M6 is effective to reduce the input resistance Rin in accordance with the following relation:

$$Rin = \frac{R2 + R3}{1 + gm4R3 + (GDS4 + gds6(R2 + R3))} \quad (16)$$

A comparison of Relations (15) and (16) above indicates that the compensating effect of the MOS transistor M6 will be the stronger, the smaller the tuning current Ituning, and become minimal upon Ituning=Is.

That which is claimed is:

1. A CMOS elementary cell of first order for time-continuous analog filters with non-linearity compensation, the CMOS elementary cell comprising:
   at least one first MOS transistor having conduction terminals connected to a first supply voltage reference and to an output terminal and having a control terminal connected to an input terminal of the first order CMOS elementary cell; and
   a second MOS transistor in a diode configuration and a capacitor both connected to an output terminal of the first order CMOS elementary cell, said second MOS transistor and said capacitor acting as a load for the first MOS transistor so that the first MOS transistor operates as a drive transistor operatively connected to an input voltage signal supplied to the input terminal of the first order CMOS elementary cell.

2. A CMOS elementary cell according to claim 1, wherein said second MOS transistor is connected between said output terminal and a second voltage reference in parallel with said capacitor.

3. A CMOS elementary cell according to claim 1, wherein said second MOS transistor is connected between the output terminal and the first supply voltage reference, and the capacitor is connected between the output terminal and a second voltage reference.

4. A CMOS elementary cell according to claim 3, further comprising a current generator connected in parallel with said capacitor between the output terminal and the second voltage reference.

5. A CMOS elementary cell according to claim 1, wherein said first and second MOS transistors and said capacitor are connected to define a single-ended configuration for the CMOS elementary cell.

6. An analog filter comprising:
   a CMOS elementary cell of first order for being connected between a first supply voltage reference and a second voltage reference, said CMOS elementary cell comprising
      at least one first MOS transistor having conduction terminals connected to the first supply voltage reference and to an output terminal and having a control terminal connected to an input terminal of the first order CMOS elementary cell, and
      a second MOS transistor in a diode configuration and a capacitor both connected to an output terminal of the first order CMOS elementary cell, said second MOS transistor and said capacitor acting as a load for the first MOS transistor so that the first MOS transistor operates as a drive transistor operatively connected to an input voltage signal supplied to the input terminal of the first order CMOS elementary cell.

7. An analog filter according to claim 6, wherein said second MOS transistor is connected between said output terminal and the second voltage reference in parallel with said capacitor.

8. An analog filter according to claim 6, wherein said second MOS transistor is connected between the output terminal and the first supply voltage reference, and the capacitor is connected between the output terminal and the second voltage reference.

9. An analog filter according to claim 8, further comprising a current generator connected in parallel with said capacitor between the output terminal and the second voltage reference.

10. An analog filter according to claim 6, wherein said first and second MOS transistors and said capacitor are connected to define a single-ended configuration for the CMOS elementary cell.

11. A CMOS elementary cell of second order for time-continuous analog filters with non-linearity compensation, the CMOS elementary cell comprising:
    at least one first MOS transistor having conduction terminals connected to a supply voltage reference and to a first output terminal, and having a control terminal connected to an input terminal of the second order CMOS elementary cell;
    a second MOS transistor in a diode configuration, connected between a first output terminal and a second output terminal of the second order CMOS elementary cell; and
    first and second capacitors connected between the first and second output terminals and a second voltage reference to serve as a load for the first MOS transistor so that the first MOS transistor operates as a drive transistor operatively connected to an input voltage signal being supplied to the input terminal of the second order CMOS elementary cell.

12. A CMOS elementary cell according to claim 11, further comprising a current generator connected in parallel with said first capacitor between the first output terminal and the second voltage reference.

13. A CMOS elementary cell according to claim 11, further comprising a current mirror connected between the first supply voltage reference and the first output terminal, and connected to said second MOS transistor.

14. A CMOS elementary cell according to claim 13, wherein said current mirror comprises first and second mirror transistors; wherein the first mirror transistor is in a diode configuration having conduction terminals connected to the first supply voltage reference and the second output terminal, and having a control terminal connected to a control terminal of the second mirror transistor also connected to the first supply voltage reference; and wherein the first and second mirror transistors are sized to provide a transfer function for the second order CMOS elementary cell with matched complex poles.

15. A CMOS elementary cell according to claim 14, further comprising a matching transistor being connected between said second mirror transistor and the first output terminal of the second order CMOS elementary cell and having a control terminal connected to the control terminal of the second MOS transistor so as to provide enhanced correlation of bias voltages of the first and second mirror transistors and, thereby provide greater accuracy of the current mirror.

16. A CMOS elementary cell according to claim 15, wherein said current mirror further comprises:
   first and second mirror resistors connected between the first supply voltage reference and, respectively, the first and second mirror transistors; and
   a capacitor connected in parallel with said second mirror resistor so as to provide a smaller ratio of currents flowing through the first and second mirror transistors than a ratio of respective transconductances of the first and second mirror transistors.

17. A CMOS elementary cell according to claim 13, further comprising a compensation circuit connected between the first supply voltage reference and the second voltage reference and connected in parallel with said current mirror.

18. A CMOS elementary cell according to claim 17, further comprising first and second current generators; and wherein said compensation circuit comprises first and second compensation mirrors connected in parallel with each other, and between the first supply voltage reference and the second voltage reference through the first and second current generators adapted to respectively supply first and second compensation currents.

19. A CMOS elementary cell according to claim 18, wherein said first compensation mirror comprises first and second compensation MOS transistors; wherein the first compensation MOS transistor has conduction terminals connected to the first supply voltage reference and the current mirror, and has a control terminal connected to the control terminal of the second compensation MOS transistor; and wherein said second compensation MOS transistor is in a diode configuration and connected between the first supply voltage reference and the first current generator so that a difference between the currents respectively supplied from the current generators is mirrored by the second compensation MOS transistor and the first compensation MOS transistor is caused to conduct.

20. A CMOS elementary cell according to claim 18, wherein said second compensation mirror comprises third and fourth compensation MOS transistors; wherein the third compensation MOS transistor has conduction terminals respectively connected to the first supply voltage reference and the first current generator, and has a control terminal connected to the control terminal of the fourth compensation MOS transistor; and wherein said fourth compensation MOS transistor is connected in a diode configuration and has conduction terminals connected to the first supply voltage reference and the second current generator.

21. A CMOS elementary cell according to claim 11, wherein said first and second MOS transistors and said first and second capacitors are connected to define a single-ended configuration.

22. An electronic circuit comprising:
   at least a first and a second stage of second order CMOS elementary cells connected in cascade;
   wherein only said first stage of said CMOS elementary cels comprises a current generator connected to a supply voltage reference for generating bias voltages so that bias currents of CMOS elementary cells in the second stage after the first stage are set directly by the bias voltages of the CMOS elementary cells in said first stage.

23. An electronic circuit according to claim 22, wherein each CMOS elementary cell of second order comprises:
   at least one first MOS transistor having conduction terminals connected to the supply voltage reference to a first output terminal, and having a control terminal connected to an input terminal of the second order CMOS elementary cell;
   a second MOS transistor in a diode configuration, connected between the first output terminal and a second output terminal of the second order CMOS elementary cell; and
   first and second capacitors connected between the first and second output terminals and a second voltage reference to serve as a load for the first MOS transistor so that the first MOS transistor operates as a drive transistor operatively connected to an input voltage signal being supplied to the input terminal of the second order CMOS elementary cell.

24. An analog filter comprising:
   a CMOS elementary cell of second order for being connected between a first supply voltage reference and a second voltage reference, the CMOS elementary cell comprising
   at least one first MOS transistor having conduction terminals connected to the supply voltage reference to a first output terminal, and having a control terminal connected to an input terminal of the second order CMOS elementary cell,
   a second MOS transistor in a diode configuration, connected between a first output terminal and a second output terminal of the second order CMOS elementary cell, and
   first and second capacitors connected between the first and second output terminals and the second voltage reference to serve as a load for the first MOS transistor so that the first MOS transistor operates as a drive transistor operatively connected to an input voltage signal being supplied to the input terminal of the second order CMOS elementary cell.

25. An analog filter according to claim 24, further comprising a current generator connected in parallel with said first capacitor between the first output terminal and the second voltage reference.

26. An analog filter according to claim 24, further comprising a current mirror connected between the first supply voltage reference and the first output terminal, and connected to said second MOS transistor.

27. An analog filter according to claim 26, wherein said current mirror comprises first and second mirror transistors; wherein the first mirror transistor is in a diode configuration having conduction terminals connected to the first supply voltage reference and the second output terminal, and having a control terminal connected to a control terminal of the second mirror transistor also connected to the first supply voltage reference; and wherein the first and second mirror transistors are sized to provide a transfer function for the second order CMOS elementary cell with matched complex poles.

28. An analog filter according to claim 27, further comprising a matching transistor being connected between said second mirror transistor and the first output terminal of the second order CMOS elementary cell and having a control terminal connected to the control terminal of the second MOS transistor so as to provide enhanced correlation of bias voltages of the first and second mirror transistors and, thereby provide greater accuracy of the current mirror.

29. An analog filter according to claim 28, wherein said current mirror further comprises:
   first and second mirror resistors connected between the first supply voltage reference and, respectively, the first and second mirror transistors; and a compensation capacitor connected in parallel with said second mirror resistor so as to provide a smaller ratio of currents flowing through the first and second mirror transistors than a ratio of respective transconductances of the first and second mirror transistors.

30. An analog filter according to claim 26, further comprising a compensation circuit connected between the first supply voltage reference and the second voltage reference and connected in parallel with said current mirror.

31. An analog filter according to claim 30, further comprising first and second current generators; and wherein said compensation circuit comprises first and second compensation mirrors connected in parallel with each other, and between the first supply voltage reference and the second voltage reference through the first and second current generators adapted to respectively supply first and second compensation currents.

32. An analog filter according to claim 31, wherein said first compensation mirror comprises first and second compensation MOS transistors; wherein the first compensation MOS transistor has conduction terminals connected to the first supply voltage reference and the current mirror, and has a control terminal connected to the control terminal of the second compensation MOS transistor; and wherein said second compensation MOS transistor is in a diode configuration and connected between the first supply voltage reference and the first current generator so that a difference between the currents respectively supplied from the current generators is mirrored by the second compensation MOS transistor and the first compensation MOS transistor is caused to conduct.

33. An analog filter according to claim 32, wherein said second compensation mirror comprises third and fourth compensation MOS transistors; wherein the third compensation MOS transistor has conduction terminals respectively connected to the first supply voltage reference and the first current generator, and has a control terminal connected to the control terminal of the fourth compensation MOS transistor; and wherein said fourth compensation MOS transistor is connected in a diode configuration and has conduction terminals connected to the first supply voltage reference and the second current generator.

34. An analog filter according to claim 24, wherein said first and second MOS transistors and said first and second equivalent capacitors are connected in a single-ended configuration.

35. An analog filter according to claim 24, further comprising means for providing a fully differential configuration.

* * * * *